United States Patent
El-Khamy et al.

(10) Patent No.: US 11,043,976 B2
(45) Date of Patent: *Jun. 22, 2021

(54) SYSTEM AND METHODS FOR LOW COMPLEXITY LIST DECODING OF TURBO CODES AND CONVOLUTIONAL CODES

(71) Applicant: Samsung Electronics Co., Ltd., Gyeonggi-do (KR)

(72) Inventors: Mostafa El-Khamy, San Diego, CA (US); Jinhong Wu, San Diego, CA (US); Jungwon Lee, San Diego, CA (US); Inyup Kang, San Diego, CA (US)

(73) Assignee: Samsung Electronics Co., Ltd

( * ) Notice: Subject to any disclaimer, the term of this patent is extended or adjusted under 35 U.S.C. 154(b) by 0 days.

This patent is subject to a terminal disclaimer.

(21) Appl. No.: 16/272,653

(22) Filed: Feb. 11, 2019

(65) Prior Publication Data

US 2019/0173497 A1    Jun. 6, 2019

Related U.S. Application Data

(63) Continuation of application No. 14/565,082, filed on Dec. 9, 2014, now Pat. No. 10,205,470.
(Continued)

(51) Int. Cl.
*H03M 13/00* (2006.01)
*H03M 13/39* (2006.01)
(Continued)

(52) U.S. Cl.
CPC ..... *H03M 13/3905* (2013.01); *G06F 11/1004* (2013.01); *H03M 13/3922* (2013.01);
(Continued)

(58) Field of Classification Search
CPC ........ G06F 11/1004; G11B 2020/1843; H03M 13/3927; H03M 13/3905; H03M 13/3922;
(Continued)

(56) References Cited

U.S. PATENT DOCUMENTS 6,731,700 B1    5/2004  Yakhnich et al.
7,032,156 B2 *  4/2006  Yu .................... H03M 13/2957
                                                        714/755

(Continued)

OTHER PUBLICATIONS

Jos Akhtman et al., Low Complexity Approximate Log-Map Detection for MIMO Systems. IEEE, 2006, School of ECS., Univ. of Southampton, SO17 1BJ, UK.
(Continued)

*Primary Examiner* — Albert Decady
*Assistant Examiner* — Osman M Alshack
(74) *Attorney, Agent, or Firm* — The Farrell Law Firm, P.C.

(57) ABSTRACT

A method, system, and non-transitory computer-readable recording medium of decoding a signal are provided. The method includes receiving signal to be decoded, where signal includes at least one symbol; decoding signal in stages, where each at least one symbol of signal is decoded into at least one bit per stage, wherein Log-Likelihood Ratio (LLR) and a path metric are determined for each possible path for each at least one bit at each stage; determining magnitudes of the LLRs; identifying K bits of the signal with smallest corresponding LLR magnitudes; identifying, for each of the K bits, L possible paths with largest path metrics at each decoder stage for a user-definable number of decoder stages; performing forward and backward traces, for each of the L possible paths, to determine candidate codewords; performing a Cyclic Redundancy Check (CRC) on the candidate codewords; and stopping after a first candidate codeword passes the CRC.

11 Claims, 9 Drawing Sheets

Related U.S. Application Data

(60) Provisional application No. 61/939,909, filed on Feb. 14, 2014.

(51) Int. Cl.

| | | |
|---|---|---|
| *G06F 11/10* | (2006.01) | |
| *G11B 20/18* | (2006.01) | |
| *H03M 13/37* | (2006.01) | |
| *H03M 13/45* | (2006.01) | |

(52) U.S. Cl.
CPC . *H03M 13/3972* (2013.01); *G11B 2020/1843* (2013.01); *H03M 13/3738* (2013.01); *H03M 13/451* (2013.01)

(58) Field of Classification Search
CPC .......... H03M 13/451; H03M 13/3738; H03M 13/2957; H03M 13/09
USPC ................ 714/752, 755, 758, 807, 786, 794
See application file for complete search history.

(56) References Cited

U.S. PATENT DOCUMENTS

| | | | |
|---|---|---|---|
| 7,669,105 | B2 | 2/2010 | Pisek et al. |
| 7,747,922 | B2 | 6/2010 | Mielczarek et al. |
| 7,895,497 | B2 | 2/2011 | Pisek et al. |
| 8,064,548 | B2 | 11/2011 | Sundberg et al. |
| 8,352,840 | B2 | 1/2013 | Crozier et al. |
| 10,061,641 | B2 * | 8/2018 | Kim .................... G06F 11/1012 |
| 2002/0124227 | A1 | 9/2002 | Nguyen |
| 2003/0028843 | A1 | 2/2003 | Chang |
| 2003/0043487 | A1 * | 3/2003 | Morita .............. H03M 13/6343 360/25 |
| 2003/0126545 | A1 | 7/2003 | Tan |
| 2004/0025102 | A1 | 2/2004 | Yokokawa |
| 2004/0153940 | A1 * | 8/2004 | Yu ..................... H03M 13/2957 714/746 |
| 2005/0278603 | A1 * | 12/2005 | Berens .............. H03M 13/3927 714/755 |
| 2007/0116092 | A1 | 5/2007 | Nystrom |
| 2007/0180351 | A1 * | 8/2007 | Orio .................. H03M 13/2975 714/786 |
| 2007/0300139 | A1 * | 12/2007 | Pisek ................ H03M 13/6519 714/794 |
| 2008/0028277 | A1 | 1/2008 | Cho |
| 2009/0125793 | A1 | 5/2009 | Kishigami |
| 2009/0249165 | A1 * | 10/2009 | Gracie ................ H03M 13/296 714/758 |
| 2009/0254792 | A1 * | 10/2009 | Wang ................. H03M 13/3911 714/758 |
| 2009/0327835 | A1 * | 12/2009 | Oteri ................. H04L 25/03197 714/758 |
| 2010/0281337 | A1 * | 11/2010 | Lo ..................... H03M 13/6597 714/758 |
| 2012/0005551 | A1 | 1/2012 | Gunnam |
| 2013/0124947 | A1 * | 5/2013 | Lane ................. H03M 13/4176 714/786 |
| 2013/0185610 | A1 | 7/2013 | Ould-Cheikh-Mouhamedou |
| 2013/0235957 | A1 * | 9/2013 | El Khamy ............ H04L 1/0054 375/341 |
| 2014/0153625 | A1 * | 6/2014 | Vojcic ................ H03M 13/1131 375/224 |
| 2015/0006992 | A1 | 1/2015 | Xiong |

OTHER PUBLICATIONS

Claude Berrou et al., Near Shannon limit error-correcting coding and decoding: Turbo-codes, IEEE, 1993.

* cited by examiner

SYSTEM AND METHODS FOR LOW COMPLEXITY LIST DECODING OF TURBO CODES AND CONVOLUTIONAL CODES

PRIORITY

This application is a continuation application of U.S. patent application Ser. No. 14/565,082, filed on Dec. 9, 2014 in the United States Patent and Trademark Office, which claimed priority under 35 U.S.C. § 119(a) to a U.S. Provisional patent application filed on Feb. 14, 2014 in the United States Patent and Trademark Office and assigned Ser. No. 61/939,909, the entire contents of each of which are incorporated herein by reference.

BACKGROUND OF THE INVENTION

1. Field of the Invention

The present invention relates generally to decoding turbo codes and convolutional codes, and more particularly, to low complexity list decoding of turbo codes and convolutional codes.

2. Description of the Related Art

The turbo encoder/decoder is an important component in 3rd Generation Partnership Project (3GPP) High Speed Packet Access/Long Term Evolution (HSPA/LTE) modem chipsets. A 3GPP turbo code consists of two component convolutional codes. Each component convolutional code can be represented by a trellis. Current modem chipsets employ an iterative Scaled Maximum-Log MAP (SMLM) algorithm for turbo decoding, where MAP stands for the Maximum A Posteriori probability. The goal of iterative SMLM decoding is to achieve Maximum Likelihood (ML) estimation of information bits by iterations between two constituent decoders at medium to high Signal-to-Noise Ratio (SNR). After each half turbo decoding iteration, the systematic output of each constituent decoder provides a single candidate convolutional codeword for Cyclic Redundancy Check (CRC) error detection. In this approach, the output of SMLM decoding is the ML codeword, and candidate codewords other than the most likely one of each constituent code are not explicitly identified or utilized.

The probability of a decoding error may be reduced by considering codewords other than the single most likely codeword. List turbo decoding generates a list of other very likely candidate codewords, besides the ML codeword. Hence, list decoding can decrease the decoder error probability, because the probability that all candidate codewords will fail may be significantly lower than that of the ML codeword. If an error free codeword exists in the list of candidate codewords, then it will be found via CRC error detection.

Conventional Maximum-Log MAP (MLM) decoding of a component convolutional code in one half turbo decoding iteration involves metric calculations at each trellis stage k, for each transition branch with incoming state s' and outgoing state s, MLM recursively calculates the forward and backward state metrics and the branch metrics as follows:

$$\alpha_k(s) = \max_{s'}[\alpha_{k-1}(s') + \gamma_k(s',s)]$$

$$\beta_{k-1}(s) = \max_{s'}[\beta_k(s) + \gamma_k(s',s)]$$

$$\sigma_k(s',s) = \alpha_{k-1}(s') + \gamma_k(s',s) + \beta_{k-1}(s).$$

Based on the metric $\sigma_k(s', s)$ for the branch with incoming state s' and outgoing state $\sigma_k(s', s)$, MLM produces a Log Likelihood Ratio (LLR) for the k-th bit as $$\Lambda_k = \max_{(s',s):u_k(s',s)=0} \sigma_k(s',s) - \max_{(s',s):u_k(s',s)=1} \sigma_k(s',s).$$

Taking the sign of the LLR of each information bit, the hard-decision vector which corresponds to the Maximum-Likelihood (ML) path of the component code is produced.

Maximum-Log List (MLL) decoding performs the same forward recursions for all $\alpha_k(s)$ as the standard MLM algorithm. Then, based on the value of $\sigma_k(s', s)$, it ranks all path metrics available from the MLM algorithm along the backward recursion. It maintains a list of L candidate paths by the following record:

$$R(l) = \begin{pmatrix} \text{Metric} \\ \text{PreState} \\ \text{SuccState} \\ \text{TrellisStep} \end{pmatrix} = \begin{pmatrix} \sigma_k(s',s) \\ s' \\ s \\ k \end{pmatrix}$$

The steps of conventional MLL decoding for information block length B and a list size L are as follows:

i. at stage B, rank all path metrics $\sigma_B(s', s)$, and record the L best ones;

ii. for each stage k=B−1, ..., 1 and for each path metric $\sigma_k(s', s)$, for all the branches other than the $\max_s$, $\sigma_{k-1}(s')$ entering s, rank $\sigma_k(s', s)$ versus the L metrics in the list and keep the L best ones;

iii. find the corresponding L paths, and iv. check if they pass CRC.

Once the best L metrics are found, and location recorded, path forward-tracing and back-tracing is performed to identify the corresponding L trellis paths. The Maximum-Log List Algorithm (MLLA) decoder decodes on a full trellis so that path metrics generated from each trellis stage are globally consistent.

In practical modem chipsets, a turbo decoder is implemented with parallel decoding engines. Within each decoding engine, windowing or segmentation of the trellis is applied to reduce memory requirements. By parallelization and segmentation, the full trellis is divided into multiple disjoint or partially overlapping segments, where each segment is initialized independently or using only part of the information provided by the other segments. Consequently, a ranking of $\sigma_k(s', s)$ is not consistent from segment to segment. If the prior art MLLA decoding method is applied to a segmented trellis, the paths selected by the MLLA will not be the most likely ones.

Another disadvantage of the MLLA is that the complexity of searching for L best paths is not fixed. It requires ranking of the path metric at each trellis stage, and insertion of a new path record whenever a new path metric is found to be better than that of any path on the list. As observed, conventional MLLA decoding on an M state trellis, requires at most M sortings of an (L+1) list at each trellis stage, which may be a bottleneck to latency requirements.

A full trellis representation has been used to decode a convolutional code. In practical modem chipsets, turbo decoding is based on a segmented/windowed trellis representation, so that the decoder can decode different segments of the trellis simultaneously. Due to segmentation/windowing of the trellis of a turbo decoder in modem chipsets, the decoder must decode different segments of the trellis simultaneously and without complete information from the other segments. This may result in inconsistent path metrics, and therefore, a selection of candidate codewords based on comparing total accumulated path metrics may fail to identify the most likely paths. The list decoding algorithms of the articles do not provide significant gains for turbo decoding that uses a segmented/windowed trellis. Another disadvantage of conventional decoders is that maintaining a global list of the most likely codewords increases sorting complexity.

SUMMARY OF THE INVENTION

In accordance with an aspect of the present invention, a method of decoding a signal is provided. The method includes receiving a signal to be decoded, where the signal includes at least one symbol; decoding the signal in stages, where each at least one symbol of the signal is decoded into at least one bit per stage, wherein an LLR and a path metric are determined for each possible path for each at least one bit at each stage; determining magnitudes of the LLRs; identifying K bits of the signal with smallest corresponding LLR magnitudes; identifying, for each of the K bits, L possible paths with largest path metrics at each decoder stage for a user-definable number of decoder stages; performing forward and backward traces, for each of the L possible paths, to determine candidate codewords; performing a Cyclic Redundancy Check (CRC) on the candidate codewords; and stopping after a first candidate codeword passes the CRC.

In accordance with another aspect of the present invention, a method of decoding a signal is provided. The method includes receiving a signal to be decoded, where the signal includes at least one symbol; decoding the signal in stages, where each at least one symbol of the signal is decoded into at least one bit per stage, wherein an LLR and a path metric are determined for each possible path for each at least one bit at each stage; determining magnitudes of the LLRs; identifying K bits of the signal with smallest corresponding LLR magnitudes; identifying, for each of the K bits, L possible paths with largest path metrics with input 0 at each decoder stage for a user-definable number of decoder stages; identifying, for each of the K bits, L possible paths with the largest path metrics with input 1 at each decoder stage for a user-definable number of decoder stages; performing forward and backward traces, for each of the 2L possible paths, to determine candidate codewords; performing a CRC on the candidate codewords; and stopping after a first candidate codeword passes the CRC.

In accordance with another aspect of the present invention, a system for decoding a signal is provided. The system includes a first-half decoder; a second half decoder; a Logarithm-Likelihood Ratio and metrics processor; a list generation module; and a cyclic redundancy check module, wherein the list generation module is configured to execute an approximate maximum log list (AMLL) method, and wherein the list generation module is further configured to: receive the signal to be decoded, where the signal includes at least one symbol; decode the signal in stages, where each at least one symbol of the signal is decoded into at least one bit per stage, wherein an LLR for each at least one bit at each stage is determined, and identified in an LRR vector $L_{APP}$; perform a CRC on $L_{APP}$, and stopping if $L_{APP}$ passes the CRC; otherwise: determine magnitudes of the LLRs in $L_{APP}$; identify K LLRs in $L_{APP}$ with smallest magnitudes and indexing the K LLRs as $r=\{r(1), r(2), \ldots, r(K)\}$, wherein r( ) is an index and K is an integer; set $L_{max}$ to a maximum magnitude of the LLRs in $L_{APP}$ or a maximum possible LLR quantization value, wherein $L_{max}$ is a magnitude or a quantization value of an LLR; set v=1, wherein v is a variable; generate $\tilde{L}_A(r(k))=L_A(r(k))-L_{max}v_k\text{sign}[L_{APP}(r(k))]$, for k=1, 2, . . . , K, wherein $\tilde{L}_A(r(k))$ is a binary representation, $L_A(r(k))$ is an LLR of an index r(k), and $L_{max\ vk\ sign[LAPP(r(k))]}$ is an LRR of a maximum of a variable $v_k$ and LLR of index r(k); decode with $\tilde{L}_A$ to identify $\tilde{L}_{APP}$, wherein $\tilde{L}_{APP}$ is an LLR vector; and perform a CRC on $\tilde{L}_{APP}$, and stop if $\tilde{L}_{APP}$ passes the CRC or $v=2^{K-1}$; otherwise: increment v and return to generate $\tilde{L}_A(r(k))$.

In accordance with another aspect of the present invention, a system for decoding a signal is provided. The system includes a selector configured to select a least K a posteriori probability (APP) log-likelihood ratios (LLRs); a Kbit counter; an $\tilde{L}_A(r(k))$ generator configured to generate $\tilde{L}_A(r(k))=L_A(r(k))-L_{max}v_k\text{sign}[L_{APP}(r(k))]$, for k=1, 2, . . . , K, wherein $\tilde{L}_A(r(k))$ is a binary representation, $L_A(r(k))$ is an LLR of an index r(k), and $L_{max\ vk\ sign[LAPP(r(k))]}$ is an LRR of a maximum of a variable $v_k$ and LLR of index r(k); a first-half decoder configured to decode $\tilde{L}_A$ to identify $\tilde{L}_{APP}$, wherein $\tilde{L}_{APP}$ is an LLR vector; and a cyclic redundancy check module, wherein the first-half decoder is configured to receive the signal to be decoded, where the signal includes at least one symbol; decode the signal in stages, where each at least one symbol of the signal is decoded into at least one bit per stage, wherein a log-likelihood ratio (LLR) for each at least one bit at each stage is determined and identified in an LRR vector $L_{APP}$; perform a cyclic redundancy check (CRC) on $L_{APP}$, and stopping if $L_{APP}$ passes the CRC; otherwise, determine magnitudes of the LLRs in $L_{APP}$; identify K LLRs in $L_{APP}$ with smallest magnitudes and indexing the K LLRs as $r=\{r(1), r(2), \ldots, r(K)\}$, wherein r( ) is an index and K is an integer; set $L_{max}$ to a maximum magnitude of the LLRs in $L_{APP}$ or a maximum possible LLR quantization value, wherein $L_{max}$ is a magnitude or a quantization value of an LLR; set v=1, wherein v is a variable; generate $\tilde{L}_A(r(k))=L_A(r(k))-L_{max}v_k\text{sign}[L_{APP}(r(k))]$, for k=1, 2, . . . , K, wherein $\tilde{L}_A(r(k))$ is a binary representation, $L_A(r(k))$ is an LLR of an index r(k), and $L_{max\ vk\ sign[LAPP(r(k))]}$ is an LRR of a maximum of a variable $v_k$ and LLR of index r(k); decode with $\tilde{L}_A$ to identify $\tilde{L}_{APP}$, wherein $\tilde{L}_{APP}$ is an LLR vector; and perform a CRC on $\tilde{L}_{APP}$, and stop if $\tilde{L}_{APP}$ passes the CRC or $v=2^{K-1}$; otherwise, increment v and return to generate $\tilde{L}_A(r(k))$.

In accordance with another aspect of the present invention, a non-transitory computer-readable recording medium having recorded thereon a program for decoding a signal is provided, where the program, when executed by a computer, causes the computer to perform a method. The method includes receiving a signal to be decoded, where the signal includes at least one symbol; decoding the signal in stages, where each at least one symbol of the signal is decoded into at least one bit per stage, wherein a Log-Likelihood Ratio (LLR) and a path metric are determined for each possible path for each at least one bit at each stage; determining the magnitudes of the LLRs; identifying K bits of the signal with the smallest corresponding LLR magnitudes; identifying, for each of the K bits, L possible paths with the largest path metrics at each decoder stage for a user-definable number of decoder stages; performing forward and backward traces, for each of the L possible paths, to determine candidate codewords; performing a Cyclic Redundancy Check (CRC) on the candidate codewords; and stopping after a first candidate codeword passes the CRC.

BRIEF DESCRIPTION OF THE DRAWINGS

The above and other aspects, features, and advantages of the present invention will be more apparent from the following detailed description, taken in conjunction with the accompanying drawings, in which.

DETAILED DESCRIPTION OF EMBODIMENTS OF THE PRESENT INVENTION

Figure 1:
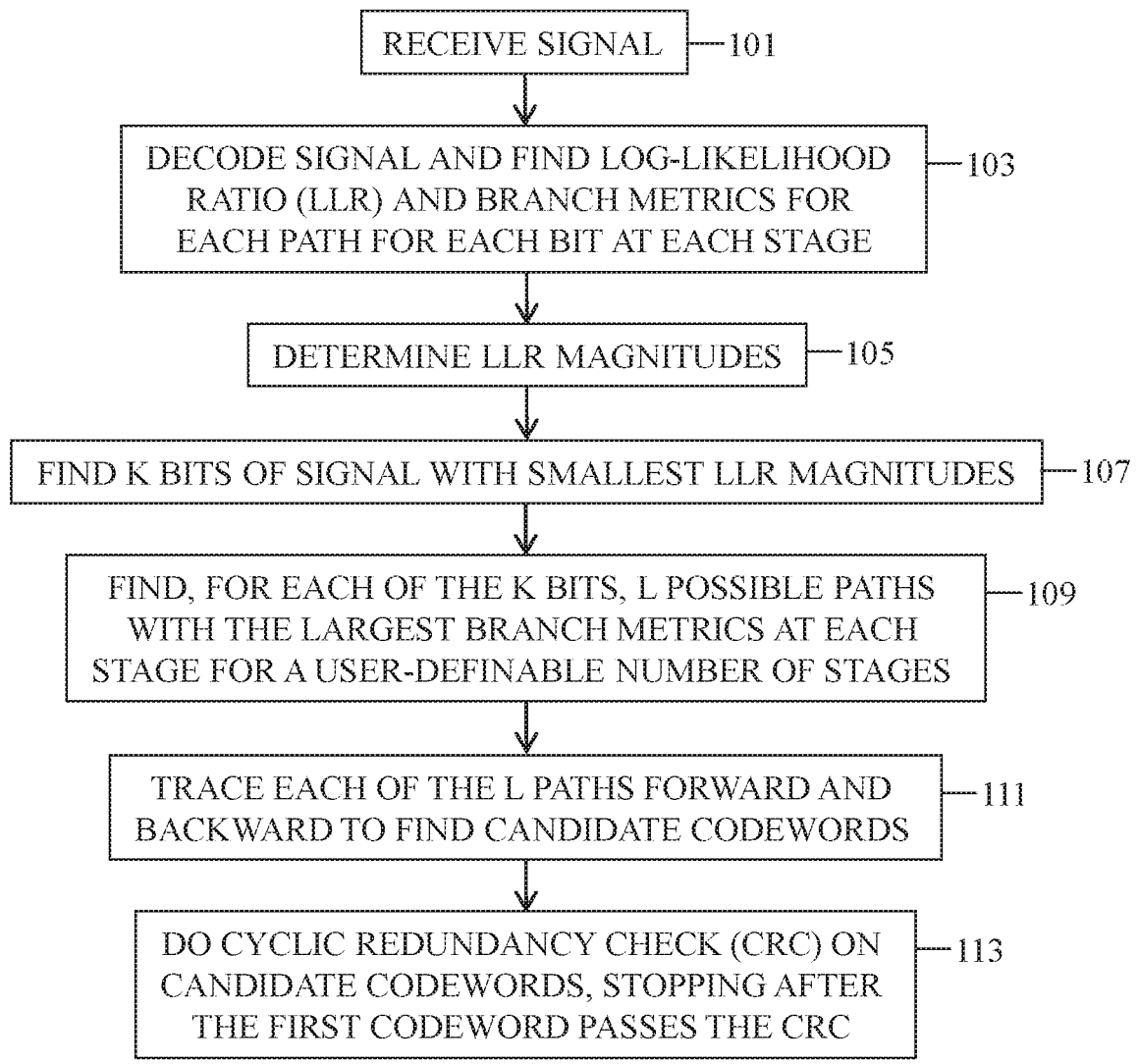
FIG. 1 is a flowchart of an Approximate MLLA (AMLLA) method according to an embodiment of the present invention.

Hereinafter, embodiments of the present invention are described in detail with reference to the accompanying drawings. In the following description, specific details such as detailed configurations and components are merely provided to assist the overall understanding of the embodiments of the present invention. Therefore, it should be apparent to those skilled in the art that various changes and modifications of the embodiments described herein may be made without departing from the scope and spirit of the present invention. In addition, descriptions of well-known functions and constructions are omitted for clarity and conciseness. The terms described below are terms defined in consideration of the functions in the present invention, and may be different according to users, intentions of the users, or customs. Therefore, the definitions of the terms should be determined based on the contents throughout the specification.

The present invention may have various modifications and various embodiments, among which embodiments will now be described in detail with reference to the accompanying drawings. However, it should be understood that the present invention is not limited to the embodiments, but the present invention includes all modifications, equivalents, and alternatives within the spirit and the scope of the present invention.

Although the terms including an ordinal number such as first, second, etc. may be used for describing various elements, the structural elements are not restricted by the terms. The terms are only used to distinguish one element from another element. For example, without departing from the scope of the present invention, a first structural element may be referred to as a second structural element. Similarly, the second structural element may also be referred to as the first structural element. As used herein, the term "and/or" includes any and all combinations of one or more associated items.

The terms used herein are merely used to describe specific embodiments and are not intended to limit the present invention. Singular forms are intended to include plural forms unless the context clearly indicates otherwise. In the description, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present specification.

Although the following description of the embodiments of the present invention uses terms and names defined for turbo codes and convolutional codes, the present invention is not limited by these terms and names, and is identically applicable to other similar systems.

The present invention provides a system and method for low complexity list decoding of turbo codes which do not require the complexity of prior art list decoding systems and methods to maintain the list of codewords. Furthermore, the system and method of the present invention not only achieves similar performance as prior art turbo list decoding in full trellis based decoder setting, but also provide better decoding gains in parallelized decoding settings. The present invention is referred to as an Approximate Maximum-Log List Algorithm (AMLLA). An alternative embodiment of the present invention is referred to as a List Maximum-Log Maximum A Posteriori (LMLM) decoding algorithm, and another alternate embodiment of the present invention is referred to as a List Maximum A Posteriori (LMAP) decoding algorithm.

The present invention provides a system and method for performing effective list decoding of turbo codes with low complexity which is applicable for full-length trellis decoding or segmented parallelized decoding. The methodology uses decoder soft output to identify the least reliable bits first. The unreliable bits output from the decoder are first identified. For each unreliable bit, several candidate codewords that maximizes the total path metric are further identified based on the partial path metrics provided by the Maximum-Log Maximum A Posteriori (MLM) decoding algorithm. A path record is used to represent each candidate codeword. After recovering the candidate codeword based on the path record, Cyclic Redundancy Check (CRC) error detection is applied. This embodiment provides multiple likely codewords, which substantially reduces the total probability of decoding failure.

In another embodiment of the present invention, after identifying the least reliable bits, the extrinsic soft information from the last turbo iteration is modified to reflect correction of errors in the least reliable bits before being provided as a priori to an MLM decoder to provide another candidate word in the list. The embodiment provides multiple likely codewords, which substantially reduces the total probability of decoding failure. In the embodiment, effective list MLM decoding is achieved by re-running an MLM module with modified prior information to generate other candidate words.

The present invention does not rely on comparisons of path metrics that are calculated from a full trellis representation of a codeword. Instead, the present invention uses path metrics calculated from a segmented trellis representation of a codeword. The path metrics of a segmented trellis are not globally consistent. The present invention can process such path metrics, whereas the prior art requires a full trellis, where path metrics are globally consistent.

The present invention identifies candidate codewords by first comparing decoding reliability based on the last decoder soft output to identify the least reliable bits, then identifying candidate codewords by selecting best path metrics provided by a decoder. Prior art MLLA or list-Viterbi methods do not identify least reliable bits in order to identify candidate codewords.

The present invention only compares path metrics at the trellis stages corresponding to the identified least reliable bits and hence does not compare path metrics for every trellis stage, as does the prior art.

The present invention requires fewer computations to decode a list of candidate codewords than does the prior art MLLA channel decoding method and, therefore, has increased performance over the prior art.

The present invention does not require global list sorting whenever a candidate codeword is added to the list, as does the prior art.

In an embodiment of the present invention, a list of candidate words is generated by flipping bits of a subset of least reliable bits in a codeword and using an MLM decoder to identify the most likely paths through the trellis representation of the codeword.

Measurement information for identifying the least reliable bits in a codeword is determined by the soft A Posteriori Probability (APP) Log-Likelihood Ratio (LLR) output of the last (i.e., the most recently completed) turbo decoding iteration, rather than being the soft-channel (detector) output before decoding, as for prior art methods.

The measurement information and metrics are used to generate a list of candidate codewords that differ, at desired positions in the codeword, from the Maximum-Likelihood (ML) codeword identified by the prior art.

The present invention identifies a list of candidate codewords by traversing other paths in a trellis representation of a codeword, rather than only identifying the ML codeword, which corresponds to the most reliable path in the trellis, as does the prior art.

To reduce the sorting complexity, instead of finding best paths by ranking $\sigma_k(s', s)$ at each trellis stage, the AMLLA of the present invention identifies the best paths by first processing the LLRs provided by the MLM (or Scaled MLM) decoding algorithm at the final second (or first) half decoding iteration.

FIG. 1 is a flow-chart of the Approximate MLLA (AMLLA) method of decoding a signal.

Referring to FIG. 1, in step 101, a signal, or codeword, to be decoded is received, where the signal includes at least one symbol.

In step 103, the signal is decoded in stages. The signal includes at least one symbol, and each symbol may be decoded into at least one bit per stage. In addition, an A-Posteriori Probability (APP) Log-Likelihood Ratios (LLR) and a branch metric $\sigma_k(s', s)$ are determined for each possible path for each at least one bit at each stage. The LLRs and the branch metric may be obtained by prior art MLM turbo decoding as follows. Conventional MLM decoding of a component convolutional code in one half turbo decoding iteration involves metric calculations at each trellis stage k, for each transition branch with incoming state s' and outgoing state s. MLM recursively calculates the forward and backward state metrics and the branch metrics as follows:

$$\alpha_k(s) = \max_{s'}[\alpha_{k-1}(s') + \gamma_k(s', s)]$$

$$\beta_{k-1}(s) = \max_{s'}[\beta_k(s) + \gamma_k(s', s)]$$

$$\sigma_k(s', s) = \alpha_{k-1}(s') + \gamma_k(s', s) + \beta_{k-1}(s).$$

In step 105, the magnitudes (i.e., absolute values) of the LLRs are determined, where magnitude indicates reliability (i.e., the lower the magnitude the lower the reliability and vice versa).

In step 107, K bits of the signal with the smallest corresponding LLR magnitudes are identified. The K bits with the smallest LLR values are the least reliable bits of the codeword. AMLLA decoding of the present invention requires an initial identification of the standard decoder APP output LLRs to identify the K unreliable stages, and only does a local identification of the branch metrics at each of the K stages, and only at the selected K stages. No identification or sorting is required for the global list at each stage and for each branch, as in prior art MLL decoding.

In another embodiment of the present invention, K bits of the signal with the opposite sign (i.e., half the states) of the K bits with the smallest corresponding LLR magnitudes may be identified. In this case, for the selected least reliable K bits, for the corresponding trellis state, the metrics of the paths corresponding to the opposite bit sign (half the states) are identified and the L best (e.g., the L with the highest magnitude) are identified.

In another embodiment of the present invention, K bits of the signal with the largest corresponding LLR magnitudes may be identified along with K bits of the signal with the opposite sign of the K bits with the largest corresponding LLR magnitudes may be identified. In this case, the L/2 most reliable paths with the bit flip and the $$\frac{L}{2} - 1$$

with the same sign, generating L−1 more paths at each stage for list decoding.

In step 109, for each of the K bits, L possible paths with the largest branch metrics at each decoder stage for a user-definable number of decoder stages are identified. The L paths are the best paths associated with the least reliable bits, which excludes the ML path identified by the prior art. The K×L paths identified are candidate codewords for the signal received. The paths may include repetitions. In AMLLA decoding of the present invention, the list is appended so path generation and CRC checking can be done after the paths have been identified at the current stage and before proceeding to the next stage. In prior art MLL decoding, the best paths are identified only after all sorts have been completed. AMLLA decoding saves many operations by selectively picking the state and state orders at which the list is generated since errors are more likely to be at the least reliable stages.

In the embodiment of the present invention where K bits of the signal with the opposite sign of the K bits with the smallest corresponding LLR magnitudes may be identified, L possible paths with the largest branch metrics at each decoder stage for a user-definable number of decoder stages are identified for each of the K bits of the signal with the opposite sign of the K bits with the smallest corresponding LLR magnitudes.

In the embodiment of the present invention where K bits of the signal with the largest corresponding LLR magnitudes may be identified and K bits of the signal with the opposite sign of the K bits with the largest corresponding LLR magnitudes are identified, (L/2)−1 possible paths with the largest branch metrics at each decoder stage for a user-definable number of decoder stages are identified for each of the K bits, and L/2 possible paths with the largest branch metrics at each decoder stage for a user-definable number of decoder stages are identified for each of the K bits of the signal with the opposite sign of the K bits with the largest corresponding LLR magnitudes.

In step 111, forward and backward traces are performed, for each of the L possible paths, to determine candidate codewords. That is, complete paths in the trellis representation of the signal are identified, which may be segments of a larger signal.

In step 113, a Cyclic Redundancy Check (CRC) is performed on the candidate codewords. Upon a first codeword passing the CRC, the method is stopped.

Figure 2:
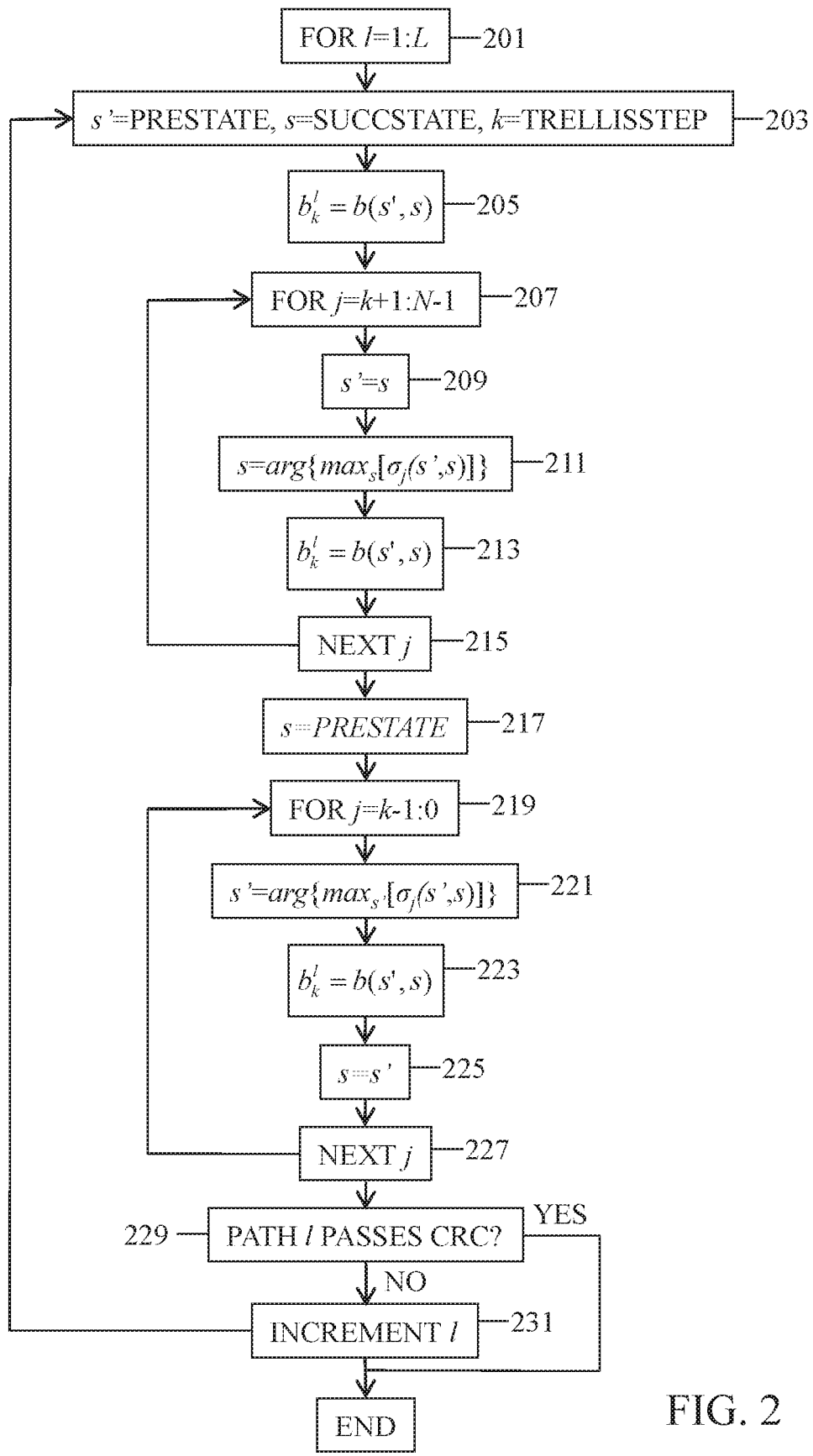
FIG. 2 is a flowchart of a forward and backward trace method according to an embodiment of the present invention.

FIG. 2 is a flow-chart of a forward and backward trace method according to the present invention for identifying complete paths in the trellis representation of the signal, which may be a segment of a larger signal.

Referring to FIG. 2, in step 201, l=1, for l=1, 2, . . . , L is set, where the traces are done for all L of the identified paths, and where l is a particular path (or codeword) being traced in the forward and backward directions.

In step 203, s'=PreState, s=SuccState, and k=TrellisStep are set, where s', s, and k are as defined in prior art MLM decoding as trellis stage k, incoming state s', and outgoing state s.

In step 205, $b_k^l$=b(s', s) is determined, where $b_k^l$ is a bit of the codeword at stage k and in path l.

In step 207, j=k+1 is set, for j=k+1, k+2, . . . , N−1, which initializes a loop for finding forward traces in path l.

In step 209, s'=s is set (i.e., making the current state the immediately preceding state for path l).

In step 211, s=arg{$\max_s[\sigma_j(s', s)]$} is determined (i.e., determining the new immediately successive state for path l), where $\sigma_k(s', s)$ is a branch metric, as defined above.

In step 213, $b_k^l$=b(s', s) is determined, where $b_k^l$ is a bit of the codeword at stage k and in path l.

In step 215, j is incremented, and the process returning to step 207 to of set j=k+1 if j<N−1. Otherwise, the process proceeds to step 217. That is, the process either returns to identify additional forward traces in path l or stops looking for additional forward traces in path l, and proceeds to the next loop for identifying backward traces in path l.

In step 217, s=Prestate is set (i.e., setting the successive state to the immediately preceding state).

In step 219, j=k−1, for j=k−1 is set, k−2, . . . , 0, which initializes a loop for finding backward traces in path l.

In step 221, s'=arg{$\max_s[\sigma_j(s', s)]$} is determined (i.e., determining a next immediately preceding state), where $\sigma_k(s', s)$ is a branch metric, as defined above.

In step 223, $b_k^l$=b(s', s) is determined, where $b_k^l$ is a bit of the codeword at stage k and in path l.

In step 225, s=s' is set (i.e., setting the successive state to the immediately preceding state).

In step 227, j is incremented, and the process returns to step 219 to set j=k−1 if j>0. Otherwise, the process proceeds to step 229. That is, the process either returns to identify additional backward traces or stops looking for additional backward traces (i.e., a path l, or codeword, has been completely identified), and proceeds to step 229 for performing Cyclic Redundancy Checks on the identified path l.

In step 229, CRC is performed on l, and stops if l passes the check. Otherwise, the process proceeds to step 231.

In step 231, l is incremented and the process returns to step 203 to set s'=PreState, s=SuccState, and k=TrellisStep and to look for the next path.

The trace-back operation is approximated to consider only paths that only diverge once from the ML paths. However, it can be shown that such single divergence approximation produces the second and third most likely paths as without the approximation.

Since the present invention does not perform a global list search, a path identified at a later stage may be the same as one identified earlier. Hence, the complexity of the present invention may be further reduced in an embodiment of the present invention by keeping track of repeated paths, where paths that have already been recovered at a selected trellis stage but failed to pass CRC, should not be regenerated at a later trellis stage. This will save steps during path recovery and CRC detection for that path. Furthermore, once an identified path merges with the ML path in the forward or backward direction, the remaining trace-forward or trace-backward path recovery operations may be stopped, and the rest of the path may be considered to be the same as in the ML path.

A distinction between the present invention and the prior art MLLA is that the present invention identifies L best local paths at each stage, whereas the conventional scheme attempts to identify the best L global path. Identifying L global paths works only if the decoder is decoding a full-trellis. If less than a full trellis is decoded (e.g., segmented or windowed trellis decoding), MLLA may fail to identify the correct codeword, whereas the present invention succeeds because soft information, including LLRs and local path metrics generated by the windowed decoding, are sufficient to identify the least reliable bits as well as to recover the candidate paths.

Rather than find the L best branches regardless of the sign as described above, the L best branches for each bit sign may be found as follows. For each stage k∈$S_k$ and for each sign value {0 or 1}, corresponding path metrics $\sigma_k(s', s)$ are identified and the L best ones (e.g., the ones with the highest magnitudes) are selected so that the number of paths identified is 2KL, with possible repetitions.

Figure 3:
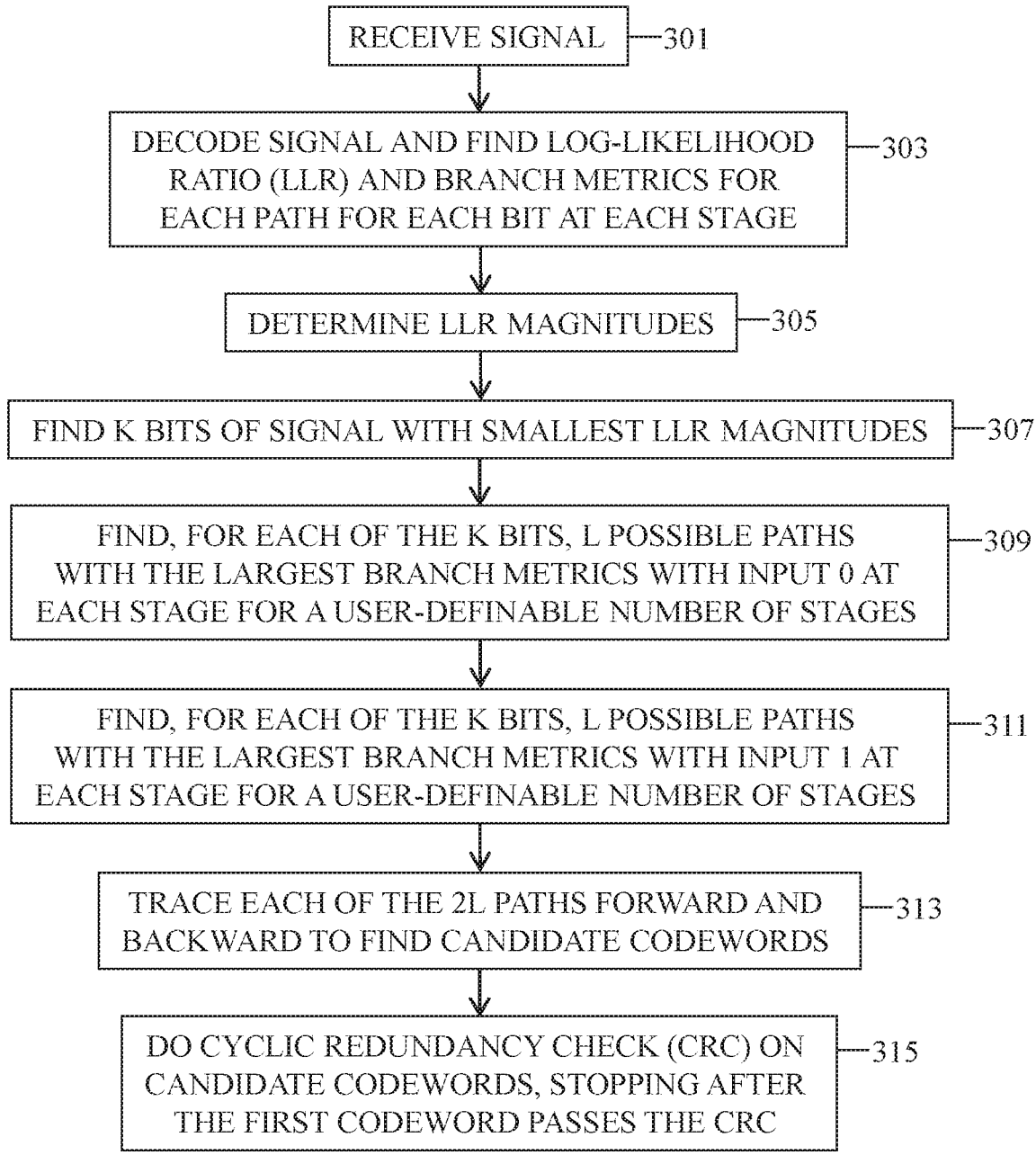
FIG. 3 is a flowchart of a method of identifying L best branches for each bit sign according to an embodiment of the present invention.

FIG. 3 is a flow-chart of a method according to the present invention for identifying the L best branches for each bit sign.

Referring to FIG. 3, in step 301, a signal to be decoded is received, where the signal includes at least one symbol.

In step 303, the signal is decoded in stages, where each at least one symbol of the signal is decoded into at least one bit per stage, wherein a Log-Likelihood Ratio (LLR) and a branch metric are determined for each possible path for each at least one bit at each stage.

In step 305, the magnitudes (i.e., absolute values) of the LLRs are determined, where the magnitudes indicate reliability (i.e., the lower the magnitude the lower the reliability and vice versa).

In step 307, K bits of the signal with the smallest corresponding LLR magnitudes are identified.

In step 309, for each of the K bits, L possible paths with the largest branch metrics with input 0 at each decoder stage for a user-definable number of decoder stages are identified.

In step 311, for each of the K bits, L possible paths with the largest branch metrics with input 1 at each decoder stage for a user-definable number of decoder stages are identified.

In step 313, forward and backward traces are performed, for each of the 2L possible paths, to determine candidate codewords.

In step 315, a Cyclic Redundancy Check (CRC) is performed on the candidate codewords, stopping after a first candidate codeword passes the CRC.

Systems, as described below, that implement the embodiments of the present invention described above require additional hardware components for a List Generation Module, a trace-forward and trace backward module, as well as a module for identifying L branches in each stage, as compared to the prior art MLLA. Below, an embodiment of the present invention is described that does not require additional hardware components for the List Generation Module.

Figure 4:
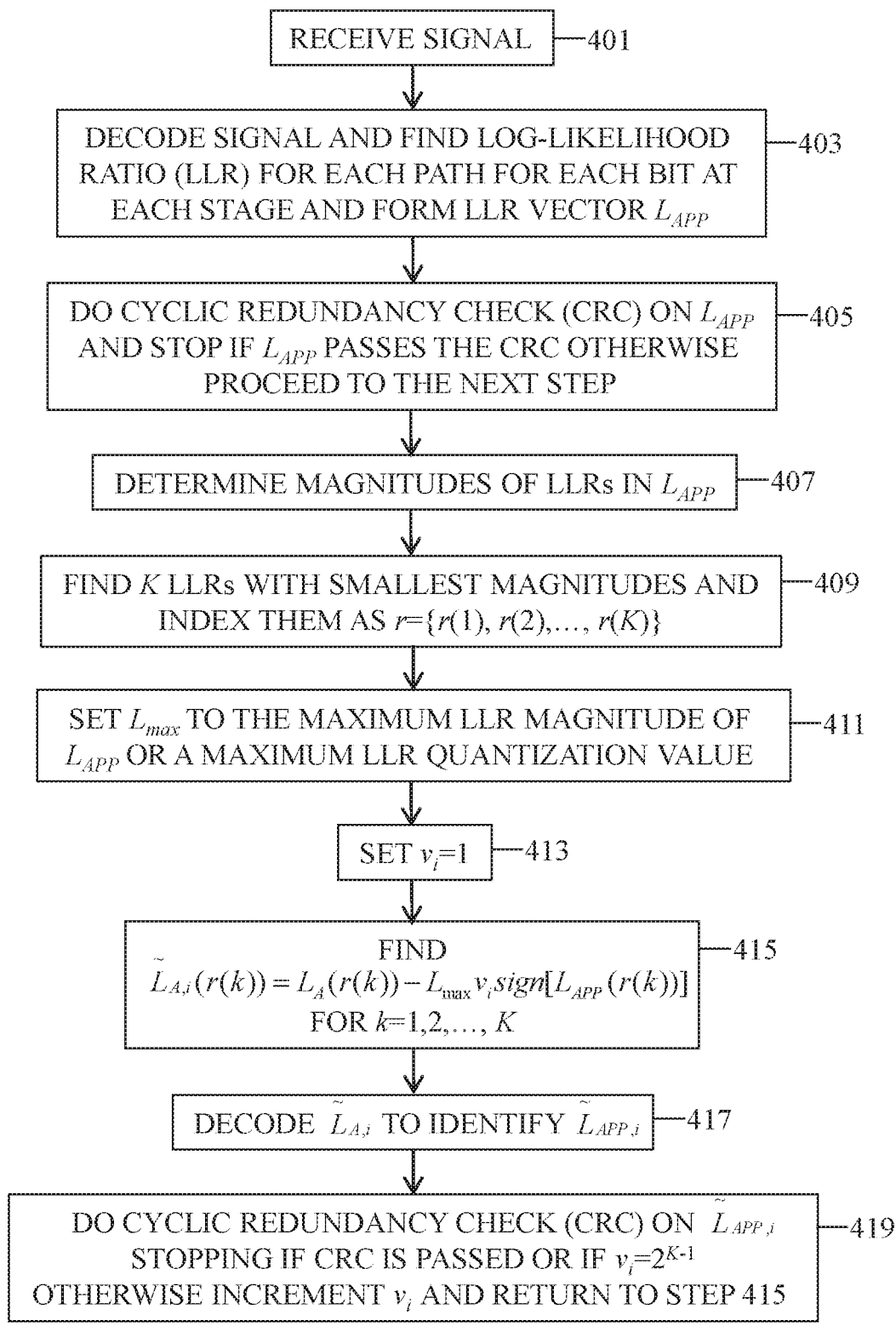
FIG. 4 is a flowchart of a method of implementing a List Generation Module that does not require additional hardware according to an embodiment of the present invention.

FIG. 4 is a flow-chart of a method according to the present invention that does not require additional hardware to implement a List Generation Module.

Referring to FIG. 4, in step 401, a signal to be decoded is received, where the signal includes at least one symbol.

In step 403, the signal is decoded in stages, where each at least one symbol of the signal is decoded into at least one bit per stage, wherein a Log-Likelihood Ratio (LLR) for each at least one bit at each stage is determined, and identified in a vector $L_{APP}$. For example, turbo decoding is performed for the maximum number of iterations, and $L_{APP}$ is the vector of A Posteriori Probability (APP) LLRs for the systematic portion (i.e., information+CRC attachment). $L_{Ext}$ is the last extrinsic output from the second component decoder to be passed as a priori to the first component decoder $L_A = \Pi^{-1}\{L_{Ext}\}$.

In step 405, a Cyclic Redundancy Check (CRC) is performed on $L_{APP}$, and is stopped if $L_{APP}$ passes the CRC. Otherwise, the process proceeds to step 407.

In step 407, the magnitudes (i.e., absolute values) of the LLRs in $L_{APP}$ are determined, where the magnitudes indicate reliability (i.e., the lower the magnitude the lower the reliability and vice versa).

In step 409, K LLRs in $L_{APP}$ with the smallest magnitudes are identified, and are indexed as $r=\{r(1), r(2), \ldots, r(K)\}$ (i.e., the K least reliable $L_{APP}$ are identified).

In step 411, $L_{max}$ is set to the maximum magnitude of the LLRs in $L_{APP}$ or a maximum possible LLR quantization value. The maximum possible LLR quantization value may be preset.

In step 413, $v_i=1$ is set, where $v_i$ is the ith value of a K-bit counter, where v can be a sequential K-bit counter seq(K) which gives all K-bit binary representation from 1 to $2^K-1$, or an n-choose-k $nCk(K,k_{max})$ counter which gives all binary sequences of length K with at most $k_{max}$ ones. In either case, |v| is the number of distinct counts of v.

In step 415, $\tilde{L}_{A,i}(r(k)) = L_A(r(k)) - L_{max} v_i \operatorname{sign}[L_{APP}(r(k))]$, for $k=1, 2, \ldots, K$, is generated.

In step 417, $\tilde{L}_{A,i}$ is decoded to identify $\tilde{L}_{APP,i}$. For example, 1$^{st}$ half turbo decoder iteration (only) with a priori LLR $\tilde{L}_{A,i}$ is executed to find new APP output $\tilde{L}_{APP,i}$.

In step 419, a Cyclic Redundancy Check (CRC) is performed on $\tilde{L}_{APP,i}$, and is stopped if $\tilde{L}_{APP,i}$ passes the CRC or $v_i = 2^{K-1}$. Otherwise, $v_i$ is incremented and the process returns to step 415 to generate $\tilde{L}_{A,i}(r(k))$.

If $L_{Ext}$ is the output from the first half decoding iterations, then in step 417 the second component decoder is executed instead. The List Generation Module is described below for the List-MLM (LMLM) decoder, where it is assumed that the component turbo decoders are standard MLM decoders. It is understood that the 1$^{st}$ and 2$^{nd}$ half decoders can be exchanged.

The performance of this embodiment gives significant improvement over standard MLM decoding and similar performance gains to the above AMLLA of the embodiment of the present invention embodiment, where LMLM with $nCk(K,k_{max})$ is denoted as $LMLM(K,k_{max})$.

In the present invention, MLM decoding may be used for the component decoder. Other variants may also be used. For example, optimal MAP decoding may be used for the 1$^{st}$ and 2$^{nd}$ half decoding iterations. When using optimal MAP decoders, the present invention may be referred to as List-MAP (LMAP).

AMLLA may be applied by replacing the last half turbo iteration with an MLM decoder. In case all half-iterations are performed with MAP decoding, then max( ) in $$\alpha_k(s) = \max_{s'}[\alpha_{k-1}(s') + \gamma_k(s', s)]$$

$$\beta_{k-1}(s) = \max_{s'}[\beta_k(s) + \gamma_k(s', s)]$$

$$\sigma_k(s', s) = \alpha_{k-1}(s') + \gamma_k(s', s) + \beta_{k-1}(s)$$

are replaced by max*( ). When the MAP (or Log MAP) algorithm is applied in convolutional decoding or turbo decoding, the LLR does not represent the difference between two individual path metrics, but rather represents the difference between max*( ) operations on two sets of path metrics, i.e., one set for all paths have a bit being 0 and the other is set to 1. However, due to numerical closeness between the max( ) and max*( ) operations, MAP and MLM algorithms are likely to provide close solutions in identifying the least reliable bits. Similarly, for path recovery via trace back and trace forward based on the least reliable bits, while the MAP algorithm provides $\alpha_k(s)$'s and $\beta_k(s)$'s that do not represent local path metrics of individual paths, applying AMLLA may not always recover the best paths that are constrained on the given previous and successive states for a given stage. This may result in different solutions than those of the MLM algorithm. However, such recovered paths are still valid codewords, and, due to MLM being a numerical approximation of MAP and vice versa, the produced list is likely to contain part, or all, of the same results that are produced by AMLLA used upon the MLM algorithm. By constraining the path search to the least reliable K bits according to APP output as described above, the generated list probably includes the plausible correct paths. As a result, AMLLA is applicable to the MAP decoder.

In an embodiment of the present invention, list decoding of convolutional codes is described, which applies for all types of convolutional codes including zero-tail or tail-biting convolutional codes.

The list generation module for AMLLA list decoding of turbo codes still applies to list decoding of convolutional codes, where a list of codewords is generated if the convolutional decoding fails, based on a posteriori output of the convolutional decoder.

In case of LMLM or LMAP decoding, due to the existence of only a component decoder, the modified extrinsic information will be zero for the non-altered bits, i.e., $\tilde{L}_{A,i}(r) = -L_{max} v_i \operatorname{sign}[L_{APP}(r)]$.

Similar extensions described above can be applied for generalized concatenations of convolutional or turbo codes.

Figure 5:
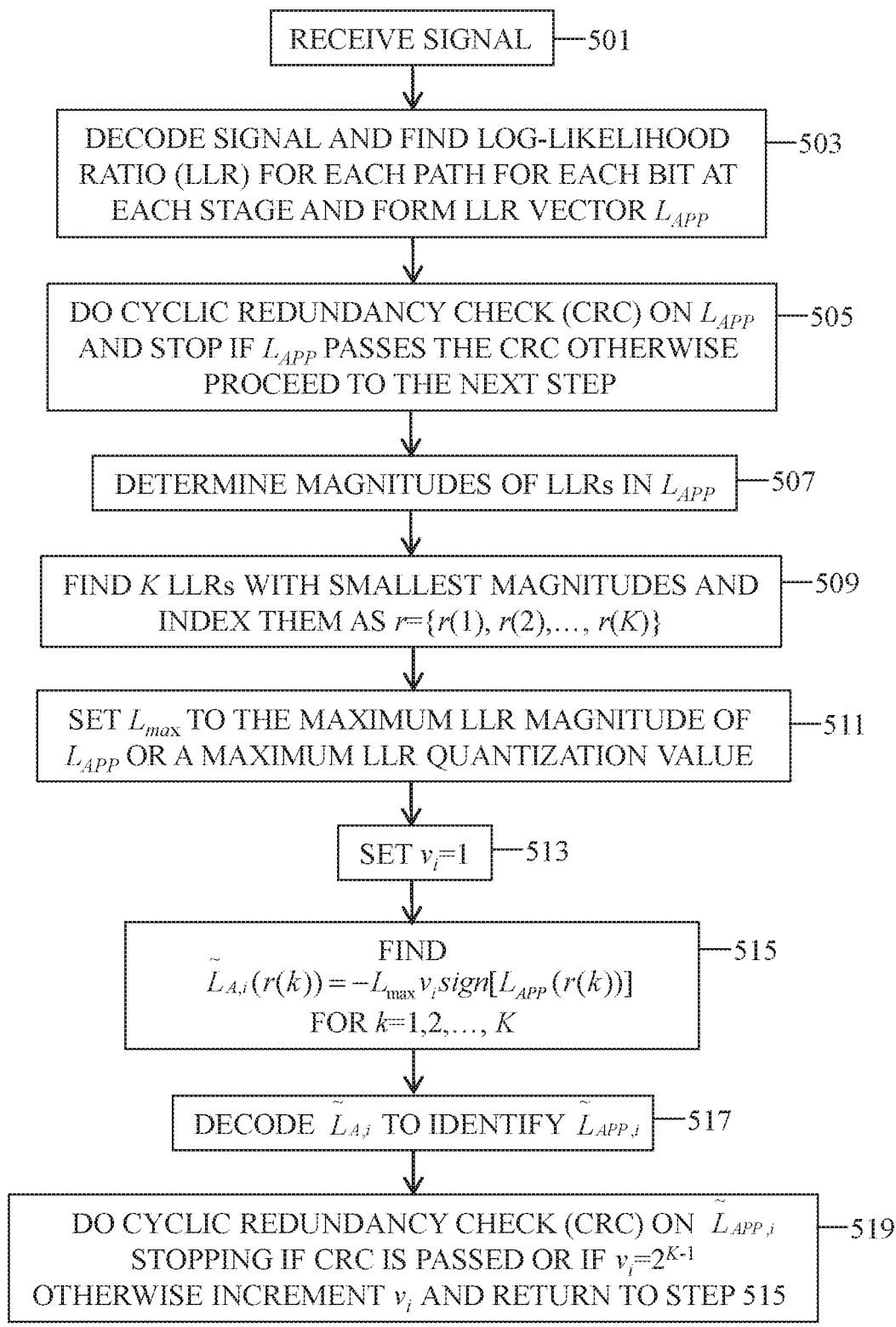
FIG. 5 is a flowchart of a method of implementing a List Generation Module that requires additional hardware according to an embodiment of the present invention.

FIG. 5 is a flow-chart of a method according to the present invention that does not require additional hardware to implement a List Generation Module.

Referring to FIG. 5, in step 501, a signal to be decoded is received, where the signal includes at least one symbol.

In step 503, the signal is decoded in stages, where each at least one symbol of the signal is decoded into at least one bit per stage, wherein a Log-Likelihood Ratio (LLR) for each at least one bit at each stage is determined, and identified in a vector $L_{APP}$.

In step 505, a Cyclic Redundancy Check (CRC) is performed on $L_{APP}$, and stops if $L_{APP}$ passes the CRC. Otherwise, the process proceeds to step 507.

In step 507, the magnitudes of the LLRs in $L_{APP}$ are determined.

In step 509, K LLRs in $L_{APP}$ with the smallest magnitudes are identified and indexed as $r=\{r(1), r(2), \ldots, r(K)\}$.

In step 511, $L_{max}$ is set to the maximum magnitude of the LLRs in $L_{APP}$ or a maximum possible LLR quantization value.

In step 513, $v_i=1$ is set.

In step 515, $\tilde{L}_{A,i}(r(k))=-L_{max}v_i \, \text{sign}[L_{APP}(r(k))]$, for $k=1, 2, \ldots, K$, is generated.

In step 517, $\tilde{L}_{A,i}$ is decoded to identify $\tilde{L}_{APP,i}$.

In step 519, a Cyclic Redundancy Check (CRC) is performed on $\tilde{L}_{APP,i}$, and stops if $\tilde{L}_{APP,i}$ passes the CRC or $v_i=2^{K-1}$. Otherwise, v is incremented and the process returns to step 515 to generate $\tilde{L}_{A,i}(r(k))$.

Figure 6:
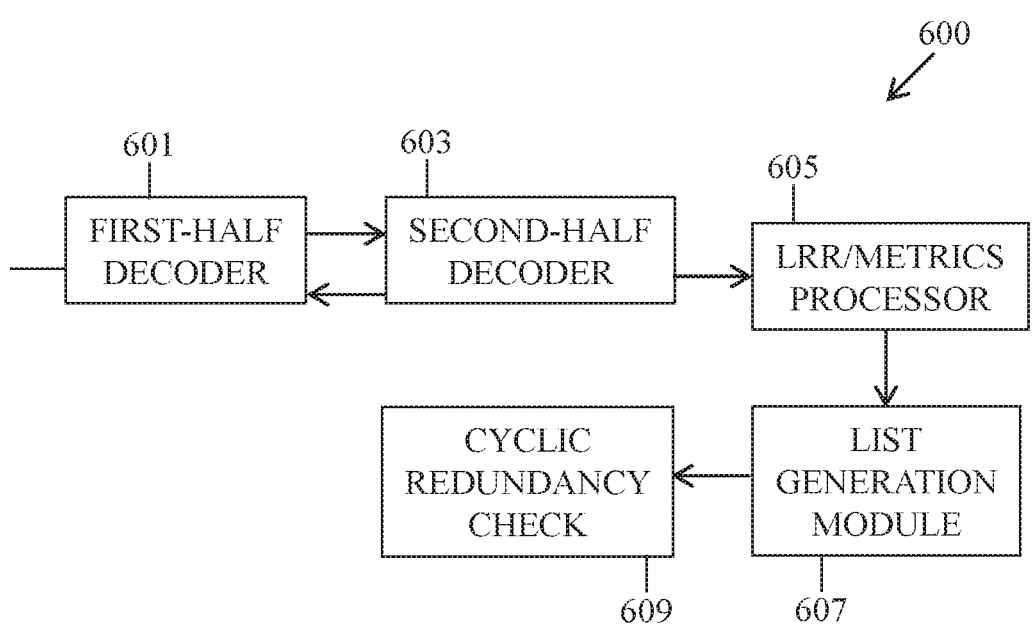
FIG. 6 is a system for decoding a signal according to an embodiment of the present invention.

FIG. 6 is a system 600 for decoding a signal according to the present invention.

Referring to FIG. 6, the system 600 includes a first-half decoder 601, a second half decoder 603, a Logarithm-Likelihood Ratio (LLR) and metrics processor 605, a list generation module 607, and a cyclic redundancy check module 609.

The first-half decoder 601 and the second-half decoder 603 are each a turbo decoder. The first-half decoder 601 may be a Maximum A Posteriori (MAP) decoder or a Maximum-Logarithm MAP (MLM) decoder. The second-half decoder 603 is the same type as the first-half decoder 601.

The Logarithm-Likelihood Ratio (LLR) and metrics processor 605 is configured to determine an A-Posteriori Probability (APP) Log-Likelihood Ratio (LLR) and a branch metric $\sigma_k(s', s)$ for each possible path for each at least one bit at each stage as described above for an Approximate Maximum-Log List Algorithm (AMLLA).

The list generation module 607 may be a list generation module configured to execute an AMLLA, an LMAP, or a LMLM, as described above.

Figure 7:
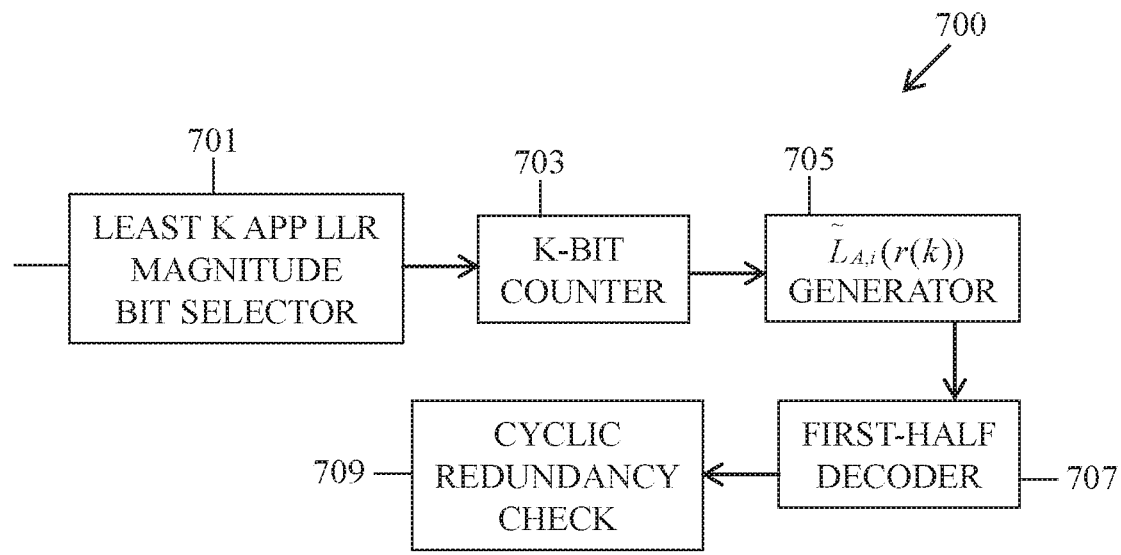
FIG. 7 is a system for decoding a signal according to an embodiment of the present invention.

FIG. 7 is a system 700 for decoding a signal according to the present invention.

Referring to FIG. 7, the system 700 includes a selector 701, a K-bit counter 703, a $\tilde{L}_{A,i}(r(k))$ generator 705, a first-half decoder 707, and a cyclic redundancy check module 709.

The selector 701 is configured to select a least K A Posteriori Probability (APP) Log-Likelihood Ratios (LLRs).

The $\tilde{L}_{A,i}(r(k))$ generator 705 is configured to generate $\tilde{L}_{A,i}(r(k))=L_A(r(k))-L_{max}v_i \, \text{sign}[L_{APP}(r(k))]$, for $k=1, 2, \ldots, K$.

The first-half decoder 707 is configured to decode $\tilde{L}_{A,i}$ to identify $\tilde{L}_{APP,i}$. The first-half decoder 707 may be a Maximum A Posteriori (MAP) decoder or a Maximum-Logarithm MAP (MLM) decoder.

Figure 8:
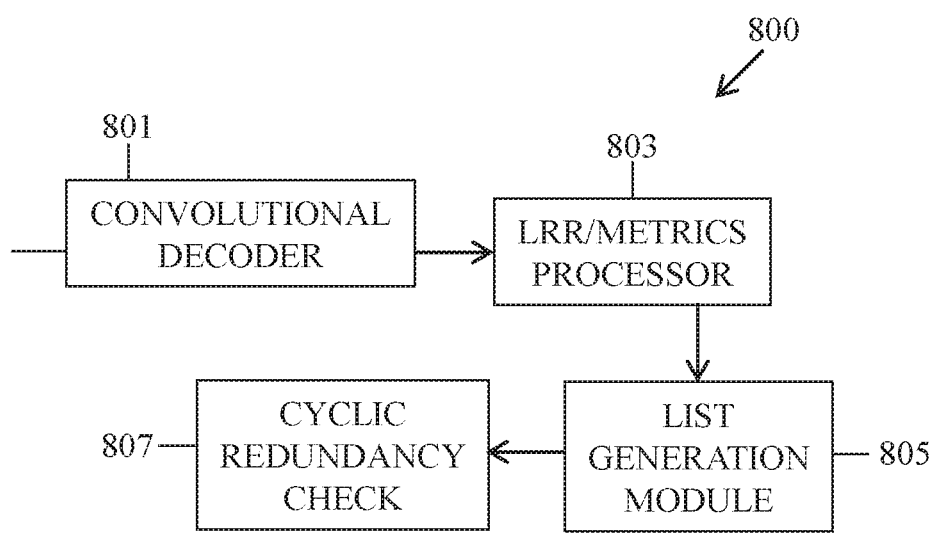
FIG. 8 is a system for decoding a signal according to an embodiment of the present invention.

FIG. 8 is a system 800 for decoding a signal according to the present invention.

Referring to FIG. 8, the system 800 includes a convolutional decoder 801, a Logarithm-Likelihood Ratio and metrics processor 803, a list generation module 805, and a cyclic redundancy check module 807.

The convolutional decoder 801 may be a Maximum A Posteriori (MAP) decoder or a Maximum-Logarithm MAP (MLM) decoder.

The Logarithm-Likelihood Ratio (LLR) and metrics processor 803 is configured to determine an A-Posteriori Probability (APP) Log-Likelihood Ratio (LLR) and a branch metric $\sigma_k(s', s)$ for each possible path for each at least one bit at each stage as described above for an Approximate Maximum-Log List Algorithm (AMLLA).

The list generation module 805 may be a list generation module configured to execute an AMLLA, an LMAP, or a LMLM, as described above.

Figure 9:
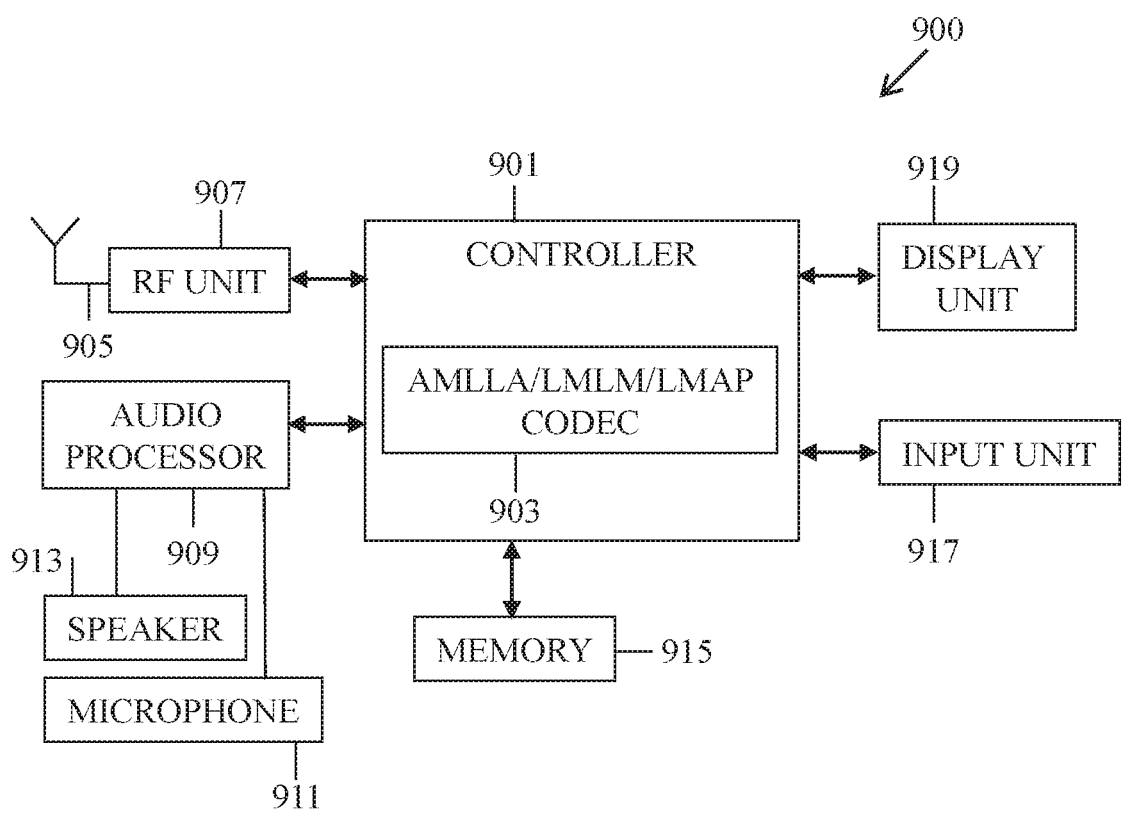
FIG. 9 is a mobile terminal according to an embodiment of the present invention.

FIG. 9 is a mobile terminal 900 according to an embodiment of the present invention.

Referring to FIG. 9, the mobile terminal 900 includes a controller 901, an antenna 905, a Radio Frequency (RF) processor 907, a microphone 909, an audio processor 911, a speaker 913, a memory 915, an input unit 917, and a display unit 919.

The controller 901 includes a decoder 903, where the coder/decoder 903 is configured to perform one of AMLLA decoding, LMAP decoding, or LMLM decoding, as described above. The controller 901 controls the general operations of the mobile terminal 900. The controller 901 includes a data processor, where the data processor includes a transmitter to encode and modulate a signal to be transmitted and a receiver to demodulate and decode a received signal. The data processor includes a modem and a COer/DECoder (i.e., CODEC) to process packet data and an audio CODEC to process an audio signal such as a voice. The data processor may provide communication according to a communication standard such as Code Division Multiple Access (CDMA), Wideband Code Division Multiple Access (WCDMA), Long Term Evolution (LTE), Wireless Fidelity (Wi-Fi), Wireless Broadband Internet (WiBro), Bluetooth, Near Field Communication (NFC), etc.

The antenna 905 receives and transmits RF signals.

The RF unit 907 performs a communication function of the mobile terminal 900. The RF unit 907 includes an RF transmitter to amplify and up-convert a frequency of a signal to be transmitted by the antenna 905, and an RF receiver to low-noise amplify a signal received by the antenna 905 and down-convert a frequency of the signal.

The audio processor 909 transmits an audio signal received via the microphone 909 to the audio CODEC of the data processor and reproduces an audio signal received from the audio CODEC of the data processor via the speaker 913.

The memory 915 includes a program memory and a data memory. The program memory stores programs to control general operations of the mobile terminal 900. The data memory stores data generated while performing programs.

The input unit 917 includes keys to input numeral and character information and function keys to set various functions.

The display unit 919 displays data output from the controller 901. The display unit 919 may be a Liquid Crystal Display (LCD), an Organic Light Emitting Diodes (OLEDs), or an Active Matrix Organic Light Emitting Diode (AMOLED). If the LCD, OLEDs, or AMOLED is configured as a touch screen, the display unit 919 may be operated as an input unit. In this case, the touch screen detects an operation such as a touch, a drop, and a drag from a change in a value of a physical characteristic, for example, resistance and capacitance. The touch screen converts the change in the value of the physical characteristic to a touch signal.

Figure 10:
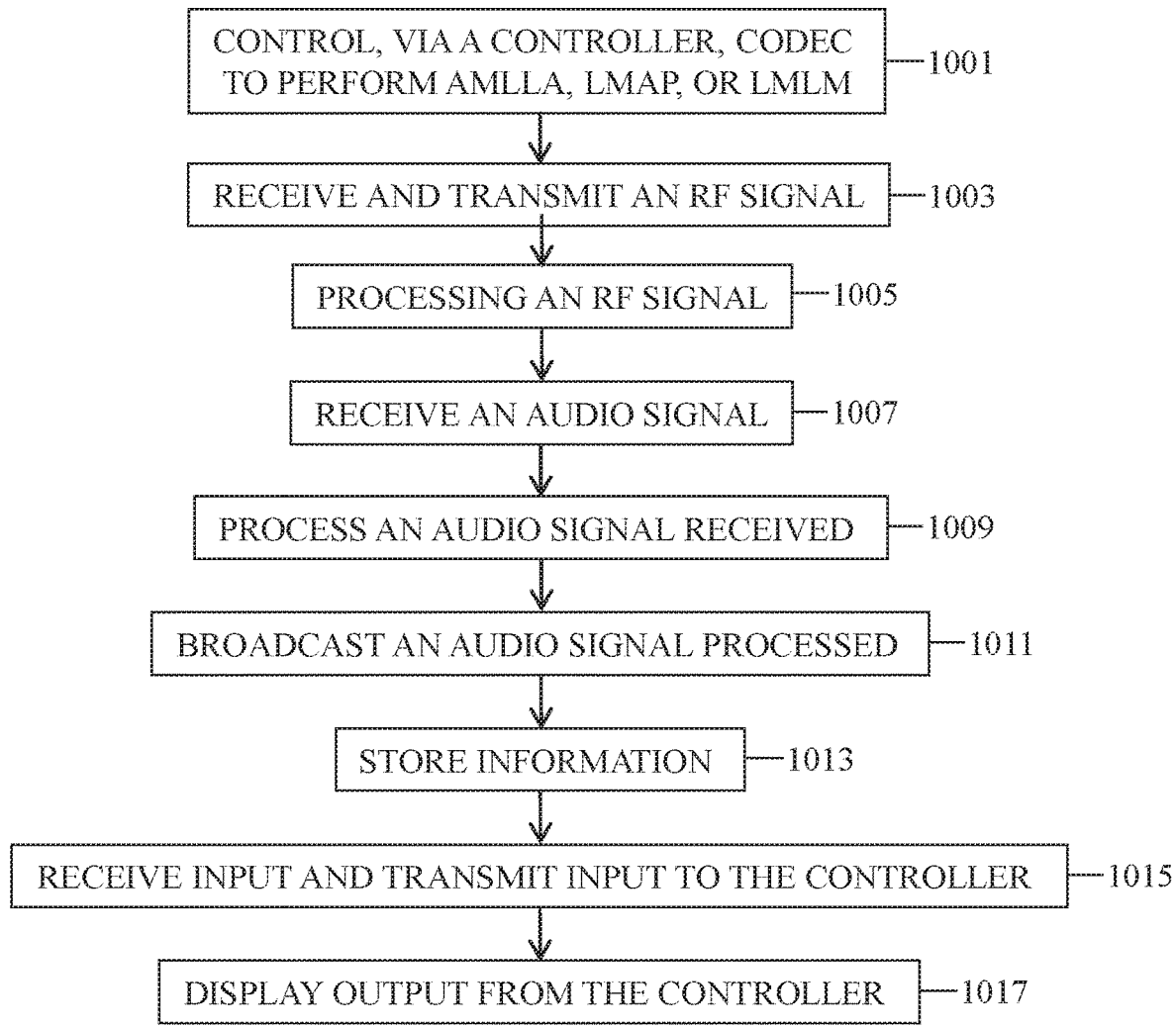
FIG. 10 is a communication method according to an embodiment of the present invention.

FIG. 10 is a communication method according to an embodiment of the present invention. The communication method includes a method for a mobile terminal.

Referring to FIG. 10, in step 1001, controlling, via a controller, a coder/decoder to perform one of AMLLA decoding, LMAP decoding, or LMLM decoding, as described above.

In step 1003, an RF signal is received and transmitted via an antenna.

In step 1005, the RF signal received, or to be transmitted, in step 1003 is processed via an RF unit.

In step 1007, an audio signal is received via a microphone.

In step 1009, the audio signal received in step 1007 is processed via an audio processor.

In step 1011, the audio signal processed in step 1009 is broadcast via a speaker.

In step 1013, information is stored in a memory, where information includes programs to control general operations of a system and data generated during the performance of a program.

In step 1015, an input is received via an input unit and transmitted to the controller.

In step 1017, data output from the controller is displayed via a display unit.

The present invention may also be implemented as computer readable codes in a non-transitory computer readable recording medium. The non-transitory computer readable recording medium is a data storage device for storing data read by a computer system. For example, the non-transitory computer readable recording medium includes a Read-Only Memory (ROM), a Random Access Memory (RAM), a Compact Disc (CD) ROM, a magnetic tape, a floppy disk, an optical data storage device, and a carrier wave (i.e., a transmission of data through the Internet). The non-transitory computer readable recording medium may be distributed through computer systems connected to a network, and thus, the computer readable code may be stored and executed in a distributed manner. Further, functional programs, codes, and code segments for establishing the present invention may easily be interpreted by programmers skilled in the art to which the present invention is applied.

Accordingly, the present invention includes a program including a code for implementing the systems and methods described in the appended claims of this specification and a non-transitory machine (a computer or the like)-readable storage medium for storing the program. Further, the program may be electronically transferred by a predetermined medium such as a communication signal transferred through a wired or wireless connection, and the present invention appropriately includes equivalents of the program.

A portable terminal according to the embodiments of the present invention may receive the program from a program providing device that is wiredly or wirelessly connected with the portable terminal, and may store the program. The program providing apparatus may include a program including instructions through which a graphic processing apparatus implements a preset content protection method, a memory for storing information or the like required for the content protecting method, a communication unit for performing wired or wireless communication with the graphic processing apparatus, and a controller for transmitting the corresponding program to a transceiver according to a request of the graphic processing apparatus or automatically.

Although the embodiments of the present invention have been described in the detailed description of the present disclosure, the present invention may be modified in various forms without departing from the scope of the present invention. Thus the scope of the present invention shall not be determined merely based on the described embodiments, but rather determined based on the accompanying claims and equivalents thereto.

What is claimed is:

1. A method of decoding a signal, comprising:
   receiving a signal to be decoded, where the signal includes at least one symbol;
   decoding the signal in stages, where each at least one symbol of the signal is decoded into at least one bit per stage, wherein a Log-Likelihood Ratio (LLR) and a path metric are determined for each possible path for each at least one bit at each stage;
   determining magnitudes of the LLRs;
   identifying K bits of the signal with smallest corresponding LLR magnitudes;
   identifying, for each of the K bits, L possible paths at each decoder stage for a user-definable number of decoder stages;
   identifying a set of paths with the highest magnitude from among the L possible paths;
   performing forward and backward traces, for each path of the identified set of paths with the highest magnitude, to determine candidate codewords;
   performing a Cyclic Redundancy Check (CRC) on the candidate codewords; and
   stopping the CRC after a first candidate codeword passes the CRC
   wherein performing forward and backward traces comprises:
   setting l=1, for l=1, 2, . . . , L;
   setting s'=PreState, s=SuccState, and k=TrellisStep;
   determining $b_k^l$=b(s', s);
   setting j=k+1, for j=k+1, k+2, . . . , N−1;
   setting s'=s;
   determining s=arg{$max_s$[$\sigma_j$(s', s)]};
   determining $b_j^l$=b(s', s);
   incrementing j and returning to the step of setting j=k+1 if j<N−1; otherwise:
   setting s=PreState;
   setting j=k−1, for j=k−1, k−2, . . . , 0;
   determining s'=arg{$max_{s'}$[$\sigma_j$(s', s)]};
   determining $b_j^l$=b(s', s);
   setting s=s'; and
   incrementing j and returning to the step of setting j=k−1 if j>0; otherwise:
   performing Cyclic Redundancy Check (CRC) on l and stopping if l passes the check, otherwise incrementing l and returning to the step of setting s'=PreState, s=SuccState, and k=TrellisStep.

2. The method of claim 1, wherein decoding the signal comprises decoding a signal using Maximum-Logarithm Maximum-A-Posteriori decoding.

3. The method of claim 1, further comprising:
   recording paths traced that failed the CRC; and
   not regenerating a path that has failed the CRC.

4. The method of claim 1, further comprising:
   stopping a forward or backward trace if a path merges with a Maximum Likelihood (ML) path and considering a rest of the path as the ML path.

5. The method of claim 1, further comprising:
identifying K bits of the signal with an opposite sign of the K bits with the smallest corresponding LLR magnitudes; and
identifying, for each of the K bits of the signal with the opposite sign of the K bits with the smallest corresponding LLR magnitudes, L possible paths with the largest path metrics at each decoder stage for a user-definable number of decoder stages.

6. The method of claim 1, further comprising:
identifying K bits of the signal with largest corresponding LLR magnitudes;
identifying, for each of the K bits, (L/2)−1 possible paths with the largest path metrics at each decoder stage for a user-definable number of decoder stages;
identifying K bits of the signal with an opposite sign of the K bits with the largest corresponding LLR magnitudes; and
identifying, for each of the K bits of the signal with the opposite sign of the K bits with the largest corresponding LLR magnitudes, L/2 possible paths with the largest path metrics at each decoder stage for a user-definable number of decoder stages.

7. A method of decoding a signal, comprising:
receiving a signal to be decoded, where the signal includes at least one symbol;
decoding the signal in stages, where each at least one symbol of the signal is decoded into at least one bit per stage, wherein a Log-Likelihood Ratio (LLR) and a path metric are determined for each possible path for each at least one bit at each stage;
determining magnitudes of the LLRs;
identifying K bits of the signal with smallest corresponding LLR magnitudes;
identifying, for each of the K bits, L possible paths with input 0 at each decoder stage for a user-definable number of decoder stages;
identifying a set of input 0 paths with the highest magnitude from among the L possible paths with input 0;
identifying, for each of the K bits, L possible paths with input 1 at each decoder stage for a user-definable number of decoder stages;
identifying a set of input 1 paths with the highest magnitude from among the L possible paths with input 1;
identifying K bits of the signal with largest corresponding LLR magnitudes;
identifying, for each of the K bits, (L/2)−1 possible paths with the largest path metrics at each decoder stage for a user-definable number of decoder stages;
identifying K bits of the signal with an opposite sign of the K bits with the largest corresponding LLR magnitudes; and
identifying, for each of the K bits of the signal with the opposite sign of the K bits with the largest corresponding LLR magnitudes, L/2 possible paths with the largest path metrics at each decoder stage for a user-definable number of decoder stages;
performing forward and backward traces, for each path of the identified set of input 0 paths and set of input 1 paths, to determine candidate codewords;
performing a Cyclic Redundancy Check (CRC) on the candidate codewords; and
stopping the CRC after a first candidate codeword passes the CRC.

8. The method of claim 7, wherein decoding the signal comprises decoding a signal using Maximum-Logarithm Maximum-A-Posteriori decoding.

9. The method of claim 7, wherein performing forward and backward traces comprises:
setting l=1, for l=1, 2, . . . , L;
setting s'=PreState, s=SuccState, and k=TrellisStep;
determining $b_k^l = b(s', s)$;
setting j=k+1, for j=k+1, k+2, . . . , N−1;
setting s'=s;
determining $s = \arg\{\max_s [\sigma_j(s', s)]\}$;
determining $b_k^l = b(s', s)$;
incrementing j and returning to the step of setting j=k+1 if j<N−1; otherwise:
setting s=PreState;
setting j=k+1, for j=k+1, k+2, . . . , 0;
determining $s' = \arg\{\max_s [\sigma_j(s', s)]\}$;
determining $b_k^l = b(s', s)$;
setting s=s'; and
incrementing j and returning to the step of setting j=k−1 if j>0; otherwise:
performing a Cyclic Redundancy Check (CRC) on l and stopping if l passes the check, otherwise incrementing l and returning to the step of setting s'=PreState, s=SuccState, and k=TrellisStep.

10. A non-transitory computer-readable recording medium having recorded thereon a program for decoding a signal, the program, when executed by a computer, causes the computer to perform a method, the method comprising:
receiving a signal to be decoded, where the signal includes at least one symbol;
decoding the signal in stages, where each at least one symbol of the signal is decoded into at least one bit per stage, wherein a Log-Likelihood Ratio (LLR) and a path metric are determined for each possible path for each at least one bit at each stage;
determining the magnitudes of the LLRs;
identifying K bits of the signal with the smallest corresponding LLR magnitudes;
identifying, for each of the K bits, L possible paths at each decoder stage for a user-definable number of decoder stages;
identifying a set of paths with the highest magnitude from among the L possible paths;
performing forward and backward traces, for each path of the identified set of paths with the highest magnitude, to determine candidate codewords;
performing a Cyclic Redundancy Check (CRC) on the candidate codewords; and
stopping the CRC after a first candidate codeword passes the CRC,
wherein performing forward and backward traces comprises:
setting l=1, for l=1, 2, . . . , L;
setting s'=PreState, s=SuccState, and k=TrellisStep;
determining $b_k^l = b(s', s)$;
setting j=k+1, for j=k+1, k+2, . . . , N−1;
setting s'=s;
determining $s' = \arg\{\max_s [\sigma_j(s', s)]\}$;
determining $b_k^l = b(s', s)$;
incrementing j and returning to the step of setting j=k+1 if j<N−1; otherwise:
setting s=PreState;
setting j=k+1, for j=k+1, k+2, . . . , 0;
determining $s' = \arg\{\max_s [\sigma_j(s', s)]\}$;
determining $b_k^l = b(s', s)$;
setting s=s'; and
incrementing j and returning to the step of setting j=k−1 if j>0; otherwise:

performing Cyclic Redundancy Check (CRC) on l and stopping if l passes the check, otherwise incrementing l and returning to the step of setting s'=PreState, s=SuccState, and k=TrellisStep.

11. The non-transitory computer-readable recording medium of claim 10, wherein decoding the signal comprises decoding a signal using Maximum-Logarithm Maximum-A-Posteriori decoding.

* * * * *